US012704272B2

(12) United States Patent
Shang et al.

(10) Patent No.: US 12,704,272 B2
(45) Date of Patent: Aug. 11, 2026

(54) ELECTRICAL CONTROL BOARD, AIR CONDITIONER OUTDOOR UNIT, AND AIR CONDITIONER

(71) Applicant: GD MIDEA AIR-CONDITIONING EQUIPMENT CO., LTD., Foshan (CN)

(72) Inventors: Zhiguo Shang, Foshan (CN); Pengji Long, Foshan (CN); Mingming Wang, Foshan (CN); Kun Zhou, Foshan (CN)

(73) Assignee: GD MIDEA AIR-CONDITIONING EQUIPMENT CO., LTD., Foshan (CN)

( * ) Notice: Subject to any disclaimer, the term of this patent is extended or adjusted under 35 U.S.C. 154(b) by 244 days.

(21) Appl. No.: 18/719,460

(22) PCT Filed: Apr. 26, 2022

(86) PCT No.: PCT/CN2022/089349

§ 371 (c)(1),
(2) Date: Jun. 13, 2024

(87) PCT Pub. No.: WO2023/115773

PCT Pub. Date: Jun. 29, 2023

(65) Prior Publication Data

US 2025/0043967 A1 Feb. 6, 2025

(30) Foreign Application Priority Data

Dec. 24, 2021 (CN) ......................... 202111603258.7
Dec. 24, 2021 (CN) ......................... 202123316012.X

(51) Int. Cl.
*H05K 1/02* (2006.01)
*F24F 1/22* (2011.01)
*F24F 1/24* (2011.01)

(52) U.S. Cl.
CPC .................. *F24F 1/22* (2013.01); *F24F 1/24* (2013.01); *H05K 1/0203* (2013.01); (Continued)

(58) Field of Classification Search
CPC . F24F 1/22; F24F 1/24; H05K 1/0203; H05K 2201/10015; H05K 2201/1003; (Continued)

(56) References Cited

U.S. PATENT DOCUMENTS

2021/0081013 A1* 3/2021 Wang ...................... G06F 1/263

FOREIGN PATENT DOCUMENTS

CN 107131561 A 9/2017
CN 208253884 U 12/2018
(Continued)

OTHER PUBLICATIONS

The World Intellectual Property Organization (WIPO) International Search Report and Written Opinion for PCT/CN2022/089349 Sep. 6, 2022 19 Pages (including translation).
(Continued)

*Primary Examiner* — Binh B Tran
(74) *Attorney, Agent, or Firm* — Anova Law Group, PLLC

(57) ABSTRACT

An electrical control board includes a substrate including first to fourth mounting areas, and having first and second side edges in a length direction. The first and second mounting areas are adjacent to the first side edge and arranged in sequence in a width direction. The third and fourth mounting areas are adjacent to the second side edge and arranged in sequence in the width direction. The electrical control board further includes a main control chip circuit in the first mounting area, an active PFC control circuit and a frequency conversion control circuit in the second mounting area, a power input circuit in the third
(Continued)

mounting area, and a function interface circuit in the fourth mounting area. The power input, active PFC control, frequency conversion control, and function interface circuits are sequentially connected. The frequency conversion control and function interface circuits are connected to the main control chip circuit.

20 Claims, 3 Drawing Sheets

(52) U.S. Cl.
CPC .............. *H05K 2201/10015* (2013.01); *H05K 2201/1003* (2013.01); *H05K 2201/10166* (2013.01); *H05K 2201/10174* (2013.01); *H05K 2201/10522* (2013.01)

(58) Field of Classification Search
CPC .......... H05K 2201/10166; H05K 2201/10174; H05K 2201/10522
USPC .......................................................... 361/748
See application file for complete search history.

(56) References Cited

FOREIGN PATENT DOCUMENTS

| | | | |
|---|---|---|---|
| CN | 208806255 | U | 4/2019 |
| CN | 110401340 | A | 11/2019 |
| CN | 210670779 | U | 6/2020 |
| CN | 212566202 | U | 2/2021 |
| CN | 213402842 | U | 6/2021 |
| CN | 113453427 | A | 9/2021 |
| CN | 113473697 | A | 10/2021 |
| CN | 216522083 | U | 5/2022 |
| JP | 6394744 | B1 | 9/2018 |
| KR | 100805422 | B1 | 2/2008 |
| WO | 2014007007 | A1 | 1/2014 |

OTHER PUBLICATIONS

The China National Intellectual Property Administration (CNIPA) The First Office Action for Chinese Application 202111603258.7 Jul. 19, 2025 18 Pages (With Translation).

* cited by examiner

ELECTRICAL CONTROL BOARD, AIR CONDITIONER OUTDOOR UNIT, AND AIR CONDITIONER

CROSS-REFERENCE TO RELATED APPLICATIONS

This application is a National Stage Entry under 35 U.S.C. § 371 of International Application No. PCT/CN2022/089349, filed on Apr. 26, 2022, which claims priority to Chinese patent application No. 202111603258.7, filed on Dec. 24, 2021 and entitled "ELECTRICAL CONTROL BOARD, AIR CONDITIONER OUTDOOR UNIT AND AIR CONDITIONER" and Chinese patent application No. 202123316012.X, filed on Dec. 24, 2021 and entitled "ELECTRICAL CONTROL BOARD, AIR CONDITIONER OUTDOOR UNIT AND AIR CONDITIONER," the entire contents of all of which are incorporated herein by reference.

TECHNICAL FIELD

The present disclosure relates to the technical field of household appliances, in particular to an electrical control board, an air conditioner outdoor unit and an air conditioner.

BACKGROUND

In the related technology, the component arrangement of an electrical control board of an air conditioner is impractical, resulting in a large board size and excessive space usage, thus restricting flexibility in a design for a whole machine. Moreover, the layout of power devices limits the heat dissipation efficiency, making it unable to adapt to higher frequency control. This layout also brings significant inconvenience to component assembly and plug-in connection during the production process.

SUMMARY

The present disclosure aims at solving at least one of the technical problems existing in the related technology. To this end, the present disclosure provides an electrical control board, which optimizes a layout of each circuit, resulting in a more reasonable design and effectively reducing the overall size of the electrical control board.

The present disclosure also provides an air conditioner outdoor unit including the electrical control board, and an air conditioner.

The electrical control board according to the embodiment in a first aspect of the present disclosure includes:

- a substrate including a first mounting area, a second mounting area, a third mounting area and a fourth mounting area, where the substrate has a first side edge and a second side edge in a length direction, the first mounting area and the second mounting area are positioned adjacent to the first side edge and arranged in sequence on the substrate in a width direction, and the third mounting area and the fourth mounting area are positioned adjacent to the second side edge and arranged in sequence on the substrate in the width direction;
- a main control chip circuit arranged in the first mounting area;
- an active power factor correction (PFC) control circuit and a frequency conversion control circuit, both of which are arranged in the second mounting area;

- a power input circuit arranged in the third mounting area;
- a function interface circuit arranged in the fourth mounting area;
- the power input circuit, the active PFC control circuit, the frequency conversion control circuit and the function interface circuit are sequentially connected, and the frequency conversion control circuit and the function interface circuit are connected to the main control chip circuit.

The electrical control board provided by the embodiment of the present disclosure has at least the following beneficial effects.

By dividing the substrate of the electrical control board into the first mounting area, the second mounting area, the third mounting area and the fourth mounting area, and mounting the main control chip circuit, the active PFC control circuit, the frequency conversion control circuit, the power input circuit and the function interface circuit in the corresponding mounting areas, the main control chip circuit, the active PFC control circuit and the frequency conversion control circuit are near to the first side of the substrate in the length direction, allowing power devices that generate more heat to be concentrated on the same side, thus facilitating heat dissipation. At the same time, the power input circuit and the function interface circuit are near to the second side edge of the substrate in the length direction. This layout allows for a more compact installation of circuits and a more reasonable design, thereby reducing the footprint of components and effectively minimizing the overall size of the electrical control board. Further, installation flexibility is improved, which contributes to higher assembly efficiency of an air conditioner outdoor unit.

According to some embodiments of the present disclosure, the first side edge is located on a left side of the substrate at a front surface, the second side edge is located on a right side of the substrate at the front surface, and in a left-right direction of the substrate, the first mounting area is adjacent to the fourth mounting area and the second mounting area is adjacent to the third mounting area.

According to some embodiments of the present disclosure, in a direction perpendicular to the left-right direction of the substrate, the first mounting area is arranged in an upper position with respect to the second mounting area, and the fourth mounting area is arranged in an upper position with respect to the third mounting area.

According to some embodiments of the present disclosure, the electrical control board further includes a motor control circuit, and the motor control circuit is arranged in the fourth mounting area.

According to some embodiments of the present disclosure, the main control chip circuit includes a control chip. With an origin at an upper right corner of the substrate, a distance between a center of the control chip and the origin in a length direction is X1, a distance between the center of the control chip and the origin in a width direction is Y1, and the following constraints are satisfied: 126 mm≤X1≤170 mm and 4 mm≤Y1≤21 mm.

According to some embodiments of the present disclosure, the active PFC control circuit includes a PFC inductor. With an origin at an upper right corner of the substrate, a distance between a center of the PFC inductor and the origin in a length direction is X2, a distance between the center of the PFC inductor and the origin in a width direction is Y2, and the following constraints are satisfied: 71 mm≤X2≤100 mm and 95 mm≤Y2≤130 mm.

According to some embodiments of the present disclosure, the active PFC control circuit further includes an insulated gate bipolar transistor (IGBT). A distance between a center of the IGBT and the origin in the length direction is X3, a distance between the center of the IGBT and the origin in the width direction is Y3, and the following constraints are satisfied: 156 mm≤X3≤191 mm and 70 mm≤Y3≤89 mm.

According to some embodiments of the present disclosure, the active PFC control circuit further includes a fast recovery diode (FRD). A distance between a center of the FRD and the origin in the length direction is X4, a distance between the center of the FRD and the origin in the width direction is Y4, and the following constraints are satisfied: 143 mm≤X4≤148 mm and 70 mm≤Y4≤89 mm.

According to some embodiments of the present disclosure, the active PFC control circuit further includes an electrolytic capacitor. A distance between a center of the electrolytic capacitor and the origin in the length direction is X5, a distance between the center of the electrolytic capacitor and the origin in the width direction is Y5, and the following constraints are satisfied: 63 mm≤X5≤95 mm and 50 mm≤Y5≤85 mm.

According to some embodiments of the present disclosure, the frequency conversion control circuit includes a first intelligent power module (IPM). With an origin at an upper right corner of the substrate, a distance between a center of the first IPM and the origin in a length direction is X6, a distance between the center of the first IPM and the origin in a width direction is Y6, and the following constraints are satisfied: 124 mm≤X6≤174 mm and 31 mm≤Y6≤ 66 mm.

According to some embodiments of the present disclosure, the second mounting area further includes a rectifier circuit, and the rectifier circuit includes a bridge rectifier. With an origin at an upper right corner of the substrate, a distance between a center of the bridge rectifier and the origin in a length direction is X7, a distance between the center of the bridge rectifier and the origin in a width direction is Y7, and the following constraints are satisfied: 133 mm≤X7≤172 mm and 98 mm≤Y7≤123 mm.

According to some embodiments of the present disclosure, the motor control circuit includes a second IPM. With an origin at an upper right corner of the substrate, a distance between a center of the second IPM and the origin in a length direction is X8, a distance between the center of the second IPM and the origin in a width direction is Y8, and the following constraints are satisfied: 50 mm≤X8≤100 mm and 18 mm≤Y8≤50 mm.

According to some embodiments of the present disclosure, the function interface circuit is provided with a plurality of sockets, which are arranged along an edge of the substrate.

According to some embodiments of the present disclosure, a length of the substrate is L, a width of the substrate is W, and the following constraints are satisfied: L≤178 mm and W≤138 mm.

An air conditioner outdoor unit according to the embodiment in a second aspect of the present disclosure includes the electrical control board of the first aspect.

The air conditioner outdoor unit according to the embodiment of the present disclosure has at least the following beneficial effects.

By adopting the electrical control board in the above embodiment, power devices that generate more heat can be concentrated on the same side of the substrate, thus facilitating heat dissipation. A more compact installation of circuits and a more reasonable layout design are realized, thereby reducing the footprint of components and effectively minimizing the overall size of the electrical control board. Further, installation flexibility is improved, which contributes to higher assembly efficiency of an air conditioner outdoor unit.

An air conditioner according to the embodiment in a third aspect of the present disclosure includes the air conditioner outdoor unit of the second aspect.

The air conditioner adopts all the technical schemes of the air conditioner outdoor unit in the above embodiment, thus having at least all beneficial effects brought by the technical schemes of the above embodiment.

Additional features and advantages of the present disclosure will be set forth in the subsequent description, and in part will become apparent from the description, or may be learned by practice of the present disclosure.

BRIEF DESCRIPTION OF DRAWINGS

The above and/or additional aspects and advantages of the present disclosure will become apparent and readily understood from the description of embodiments made in conjunction with the following accompanying drawings, in which.

LIST OF REFERENCE NUMERALS

Figure 1:
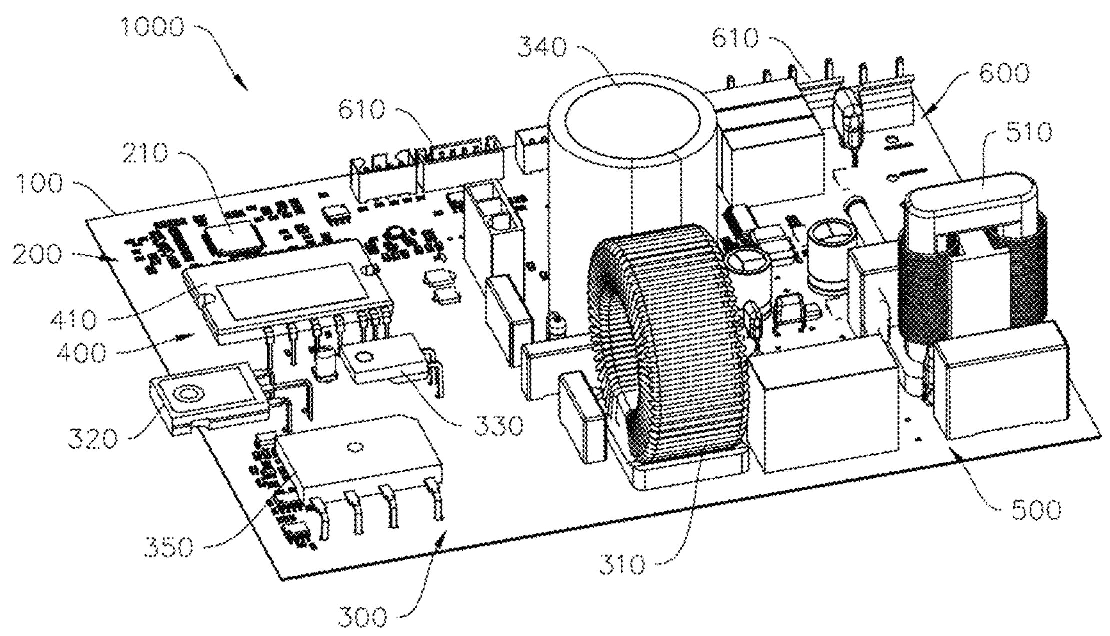
FIG. 1 is a perspective view of an electrical control board according to an embodiment of the present disclosure.

- substrate 100; first mounting area 110; second mounting area 120; third mounting area 130; fourth mounting area 140;
- main control chip circuit 200; control chip 210;
- active PFC control circuit 300; PFC inductor 310; IGBT 320; FRD 330; electrolytic capacitor 340; bridge rectifier 350; support 360; heat dissipater 370;
- frequency conversion control circuit 400; frequency conversion IPM 410;
- power input circuit 500; common mode choke 510;
- function interface circuit 600; socket 610;
- low power frequency conversion IPM 700;
- electrical control board 1000;
- electrical control box 2000; cover plate 2100.

DETAILED DESCRIPTION

Embodiments of the present disclosure will be described in detail below, examples of which are illustrated in the accompanying drawings, where the same or similar reference numerals indicate the same or similar elements or elements having the same or similar functions throughout. The embodiments described below by referring to the drawings are exemplary, only for explaining the present disclosure, and cannot be understood as limiting the present disclosure.

In the description of the present disclosure, it should be understood that, orientation or positional relationships indicated by terms such as "up," "down," "left," and "right" are based on the orientation or positional relationships shown in the accompanying drawings, and are to facilitate the description of the present disclosure and simplify the description only, rather than indicating or implying that the device or element referred to must have a specific orientation or be constructed and operated in a specific orientation, and therefore cannot be construed as limiting the present disclosure.

In the description of the present disclosure, the usage of terms such as "first," "second" etc. is solely used for the purpose of distinguishing technical features and should not be construed as indicating or implying relative importance or implicitly indicating the number of indicated technical features or implicitly indicating the sequence of indicated technical features.

In the description of the present disclosure, it is to be noted that the terms such as "arrange," "install," and "connect" should be construed in a broad sense, and those skilled in the art can determine the specific meanings of the above terms in the present disclosure in a rational way in conjunction with the specific contents of the technical schemes.

In the description of the present disclosure, descriptions referring to the terms "some embodiments," "specific embodiments" or the like mean that specific features, structures, materials or characteristics described in connection with the embodiment or example are included in at least one embodiment or example of the present disclosure. In the description, the illustrative expressions of the above-mentioned terms do not necessarily refer to the same embodiments or examples. Moreover, the specific features, structures, materials or characteristics described can be combined in any one or more embodiments or examples in any suitable manner.

It can be understood that air conditioners are usually equipped with electrical control boards, which are used to control the work of compressors, fans and other components, such that a refrigeration system can run stably. Electrical control boards are applied to split air conditioners, package air conditioners and so on. Taking an electrical control board of a frequency conversion air conditioner as an example, the electrical control board is usually equipped with a main chip module, an Intelligent Power Module (IPM), an active power factor correction (PFC) module, a power module and other functional modules. Circuit components of these functional modules are scattered across different sections of a printed circuit board, resulting in a large volume of the electrical control board. This hinders the installation process and contradicts the goal of compact electrical control board design. Moreover, the layout of power devices that generate more heat limits the heat dissipation efficiency, making it incompatible with higher frequency control demands. The dispersed components further complicate the wiring process, causing inconvenience to wire connection and plug-in connection during assembly, consuming additional time, and hampering production efficiency.

According to the embodiment of the present disclosure, the layout of power devices is optimized by improving the layout of module circuits, thus facilitating heat dissipation. A more compact installation of the module circuits is realized, thereby reducing the footprint of components and effectively minimizing the overall size of the electrical control board. Further, installation flexibility has been improved, resulting in a higher assembly efficiency of an air conditioner outdoor unit.

An electrical control board 1000 according to an embodiment of the present disclosure is described with reference to FIGS. 1 to 6. The electrical control board 1000 is suitable for an air conditioner and specifically for an air conditioner outdoor unit, and will be described below by using a specific example.

Referring to FIG. 1, the electrical control board 1000 according to the embodiment includes a substrate 100, and the substrate 100 is a printed circuit board and is substantially rectangular. The substrate 100 is provided with a main control chip circuit 200, an active PFC control circuit 300, a frequency conversion control circuit 400, a power input circuit 500 and a function interface circuit 600, and each circuit is connected with corresponding components. The various components of the main control chip circuit 200, the active PFC control circuit 300, the frequency conversion control circuit 400, the power input circuit 500 and the function interface circuit 600 are arranged on the substrate 100 at a front surface to form an overall control circuit of the electrical control board 1000.

It can be understood that the main control chip circuit 200 includes a control chip 210 and passive components connected to the control chip 210. The active PFC control circuit 300 is connected to the power input circuit 500, and an output load of the active PFC control circuit 300 is connected to the frequency conversion control circuit 400. The active PFC control circuit 300 can improve the utilization rate of a power supply during the AC to DC conversion process and reduce power loss during conversion, thereby achieving the purpose of energy saving. The frequency conversion control circuit 400 is used to control the operation of the compressor, such that a motor speed of the compressor changes with a frequency of the power supply, thereby achieving variable frequency operation of the compressor. The power input circuit 500 is used for the input of power supply to an air conditioner outdoor unit, converting incoming AC power into DC power via a rectifier circuit. This enables the provision of power to the control chip 210 and other relevant modules, while also allowing for power output to external components. The function interface circuit 600 includes a socket 610 for output of an associated load interface and a peripheral circuit connected to the socket 610.

Figure 2:
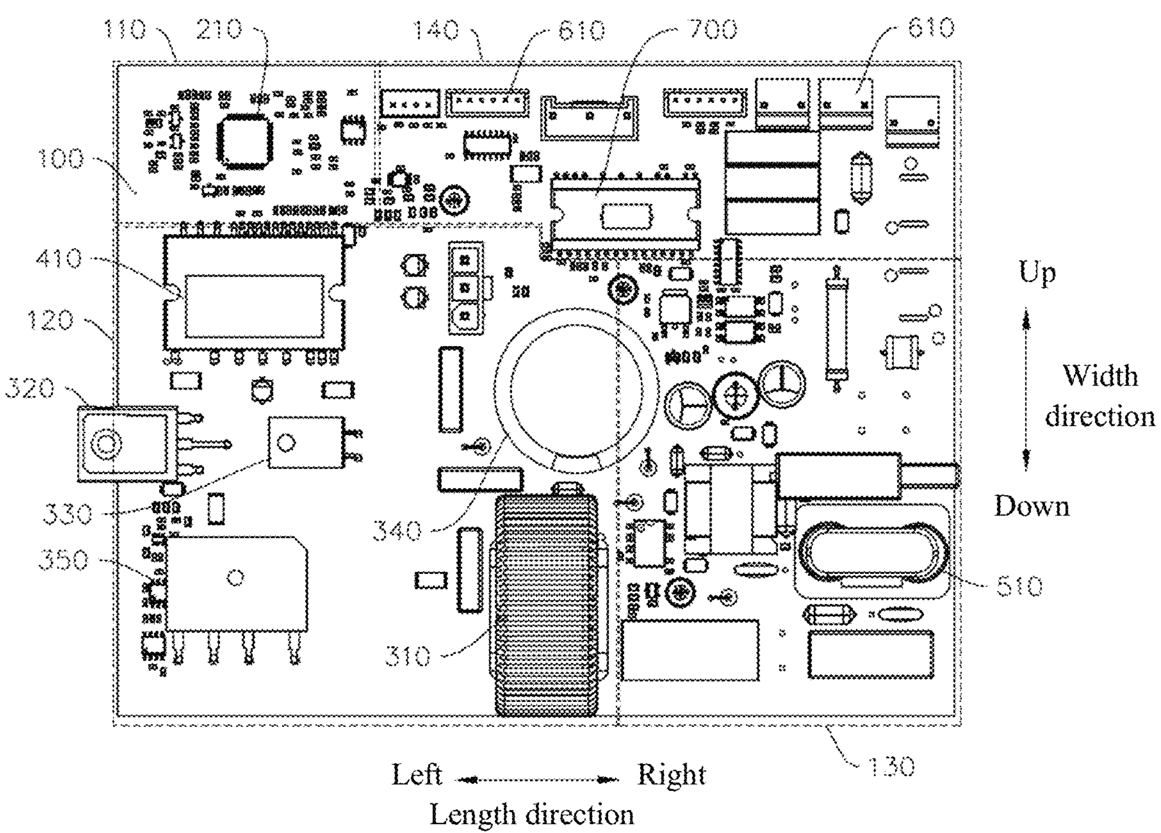
FIG. 2 is a front view of an electrical control board according to an embodiment of the present disclosure.

Referring to FIG. 2, it is a front view of the electrical control board 1000. The substrate 100 is divided into a first mounting area 110, a second mounting area 120, a third mounting area 130 and a fourth mounting area 140 at the front surface. The main control chip circuit 200 is mounted in the first mounting area 110, the active PFC control circuit 300 and the frequency conversion control circuit 400 are mounted in the second mounting area 120, the power input circuit 500 is mounted in the third mounting area 130, and the function interface circuit 600 is mounted in the fourth mounting area 140. In this way, the circuits are arranged in sections. The components of different circuits are correspondingly located and connected in different mounting areas on the substrate 100.

Take the main control chip circuit 200 as an example. The main control chip circuit 200 includes a control chip 210 and passive components surrounding the control chip. The control chip 210 and the passive components are welded in the first mounting area 110 of the substrate 100. The passive components are connected to pins of the control chip 210 through copper lines arranged on the substrate 100. The relative positions between the passive components and the control chip 210 can be arranged according to the size of the first mounting area 110. For example, the passive components include resistors, capacitors, etc. The passive components can be arranged around the control chip 210 or concentrated on one side of the control chip 210.

Referring to FIG. 2, a length direction of the substrate 100 is shown in a left-right direction in FIG. 2, and a width direction of the substrate 100 is shown in an up-down direction in FIG. 2. The substrate 100 has a first side edge and a second side edge in the length direction, the first side edge is a left side edge of the substrate 100, and the second side edge is a right side edge of the substrate 100. The first mounting area 110 and the second mounting area 120 are disposed adjacent to the left side edge, and the third mounting area 130 and the fourth mounting area 140 are disposed adjacent to the right side edge. In the width direction of the substrate 100, the first mounting area 110 is arranged in an upper position with respect to the second mounting area 120, and the fourth mounting area 140 is arranged in an upper position with respect to the third mounting area 130.

It should be noted that the first mounting area 110 and the second mounting area 120 being close to the left side edge of the substrate 100 should be understood as the first mounting area 110 and the second mounting area 120 being located on a left side of the substrate 100 in the left-right direction. Left side edges of the first mounting area 110 and the second mounting area 120 can be close to or coincide with the left side edge of the substrate 100. Similarly, the third mounting area 130 and the fourth mounting area 140 being close to the right side edge should be understood as the third mounting area 130 and the fourth mounting area 140 being located on a right side of the substrate 100 in the left-right direction. Right side edges of the third mounting area 130 and the fourth mounting area 140 can be close to or coincide with the right side edge of the substrate 100.

Referring to FIG. 2, the electrical control board 1000 further includes a motor control circuit for driving a DC motor of the fan. In this embodiment, the motor control circuit is mounted in the fourth mounting area 140, that is, both the motor control circuit and the function interface circuit 600 are mounted in the fourth mounting area 140.

It can be understood that through the above circuits, a main control board can control and adjust the active PFC circuit, variable frequency compressor, DC motor, AC power input and output of relevant load interfaces.

Referring to FIGS. 1 and 2, the active PFC control circuit 300 is mainly composed of an IGBT, an FRD, a PFC inductor 310 and an electrolytic capacitor 340. The frequency conversion control circuit 400 is mainly composed of a frequency conversion microcontroller unit (MCU) and a first IPM which is a frequency conversion IPM 410. The motor control circuit is mainly composed of a second IPM and a control MCU. The second IPM is a low power frequency conversion IPM 700.

Considering different circuits are varied in the forms and quantity of component, the size of each mounting area is designated based on specific circuit requirements. Consequently, the spaces occupied by individual mounting areas on the substrate 100 are not uniform. Specifically, in this embodiment, the first mounting area 110 is located on the substrate 100 at an upper left corner, the second mounting area 120 is located on the substrate 100 at a lower left corner, the third mounting area 130 is located on the substrate 100 at a lower right corner, and the fourth mounting area 140 is located the substrate 100 at an upper right corner. The size of each mounting area can be determined according to the number of components and installation spacing requirements, so as to meet the electrical performance requirements, allow the components of each circuit to fully utilize the space of the substrate 100, and realize a compact overall circuit installation.

It should be noted that there are no physical boundaries separating the different mounting areas. The main control chip circuit 200, the active PFC control circuit 300, the frequency conversion control circuit 400, the power input circuit 500 and the function interface circuit 600 are arranged reasonably according to the size of their respective mounting areas, and each mounting area can be defined within a certain size range according to an area where main functional components of each circuit are located. For example, in the main control chip circuit 200, the circuit is formed with the main functional component, control chip 210 and passive components surrounding the chip, and there are specific safety distance requirements between adjacent components. By arranging the components according to the safety distance requirements, the area occupied by the main control chip circuit 200 can be calculated, based on which the size of the first mounting area 110 can be determined. For the purpose of comprehension, the embodiment illustrated in FIG. 2 is provided as an example. The dashed lines in FIG. 2 can be regarded as boundaries dividing the various mounting areas on the substrate 100. The boundaries can be adjusted based on the arrangement of each circuit.

It can be understood that, under the condition of meeting the isolation requirements of heavy and weak current, signal interference prevention, and heat dissipation, it is possible to effectively utilize the area of the substrate 100, making the installation of the circuits more compact. This effectively reduces the area of substrate 100, thereby helping to reduce the overall volume of the electrical control board 1000 and minimizing material usage for the substrate 100, resulting in cost reduction for the electrical control board 1000.

Referring to FIGS. 1 and 2, the components in each circuit are arranged on the substrate 100 at the front surface, and the pins of each component can pass through the substrate 100 and be welded on the substrate 100 at a back surface (not shown in the drawings), such that the structure is more stable and reliable.

It can be understood that, as shown in FIG. 2, the main control chip circuit 200 occupies a small area, and the active PFC control circuit 300 and the frequency conversion control circuit 400 occupy a large area. Therefore, in this embodiment, the first mounting area 110 is arranged side by side with the second mounting area 120, a length of the second mounting area 120 is larger than a length of the first mounting area 110, a width of the second mounting area 120 is larger than a width of the first mounting area 110, and the sum of the width of the first mounting area 110 and the width of the second mounting area 120 is close to a width of the substrate 100, such that the first mounting area 110 and the second mounting area 120 can be arranged side by side on the left side of the substrate 100, and make full use of the space on the left side of the substrate 100 in the width direction.

Since the second mounting area 120 occupies a large area, in order to make full use of the space on the right side of the substrate 100, the third mounting area 130 is arranged to the right of the second mounting area 120 in this embodiment, and the third mounting area 130 extends in the width direction of the substrate 100, such that the sum of a length of the second mounting area 120 and a width of the third mounting area 130 is close to the length of the substrate 100, and a width of the second mounting area 120 is close to a length of the third mounting area 130.

It can be understood that the fourth mounting area 140 and the third mounting area 130 are arranged side by side on the right side of the substrate 100, such that the sum of a width of the fourth mounting area 140 and the length of the third mounting area 130 is close to the width of the substrate 100. The fourth mounting area 140 extends in the length direction of the substrate 100, such that the sum of a length of the fourth mounting area 140 and the length of the first mounting area 110 is close to the length of the substrate 100. Considering that the space of the motor control circuit is small, and the motor control circuit needs to be connected to a DC motor through a corresponding interface, it is more practical to place the motor control circuit in the fourth mounting area 140. This arrangement ensures a more efficient use of space on the substrate 100.

Referring to FIG. 2, the first mounting area 110, the second mounting area 120, the third mounting area 130 and the fourth mounting area 140 are all substantially rectangular. By properly setting the length and width dimensions of these four mounting areas, the area formed by the four mounting areas in close combination is basically consistent with the area of the substrate 100, such that the area of the substrate 100 can be fully utilized, resulting in a more compact installation and optimized design. The distribution of the module circuits is more reasonable, and the area of the substrate 100 can be effectively reduced, thereby minimizing the overall size of the electrical control board 1000. Further, the installation is more flexible and convenient, which contributes to higher assembly efficiency of an air conditioner outdoor unit.

It can be understood that two mounting areas are arranged side by side in the length direction of the substrate 100, and two mounting areas are also arranged side by side in the width direction of the substrate 100. Compared with a layout structure in which four mounting areas are arranged in sequence in the length direction, this can effectively reduce the length of the substrate 100.

It should be noted that the positions of the mounting areas are not limited to the layout shown in the above embodiment. In some embodiments, the first and second mounting areas 110 and 120 may be disposed adjacent to the right side of the substrate 100, and the third and fourth mounting areas 130 and 140 may be disposed adjacent to the left side of the substrate 100. For example, the first mounting area 110 is located on the substrate 100 at an upper right corner, the second mounting area 120 is located on the substrate 100 at a lower right corner, the third mounting area 130 is located on the substrate 100 at a lower left corner, and the fourth mounting area 140 is located on the substrate 100 at an upper left corner. Alternatively, the position of the first mounting area 110 and the position of the second mounting area 120 are exchanged, or the position of the third mounting area 130 and the position of the fourth mounting area 140 are exchanged.

Further, the shape of the mounting areas is not limited to the rectangular shape shown in the above embodiment, but may be a square or other polygonal shape. For example, the shape of the second mounting area 120 may be square, the shape of the first mounting area 110 and the third mounting area 130 may be rectangular. The fourth mounting area 140 may be in an "L" shape and is adjacent to the first mounting area 110, the second mounting area 120 and the third mounting area 130, such that all the mounting areas can be closely matched to form a rectangular shape as a whole.

It can be understood that by adopting the layout of the embodiment shown in FIG. 2, the circuits can be installed more compactly, thereby effectively reducing the area occupied by the circuits on the substrate 100. That is, the installation of the module circuits of the electrical control board 1000 can be realized by adopting the substrate 100 with a small size. In some embodiments, the length L of the substrate 100 is 178 mm, and the width W of the substrate 100 is 138 mm. Compared with a conventional electrical control board 1000, the overall volume of the electrical control board 1000 can be greatly reduced, and the installation is more flexible and convenient. It should be noted that by optimizing the layout of the module circuits of the electrical control board 1000, the size of the substrate 100 can satisfy the following constraints: $L \leq 178$ mm and $W \leq 138$ mm. The specific setting can be determined according to the actual installation requirements.

Figure 3:
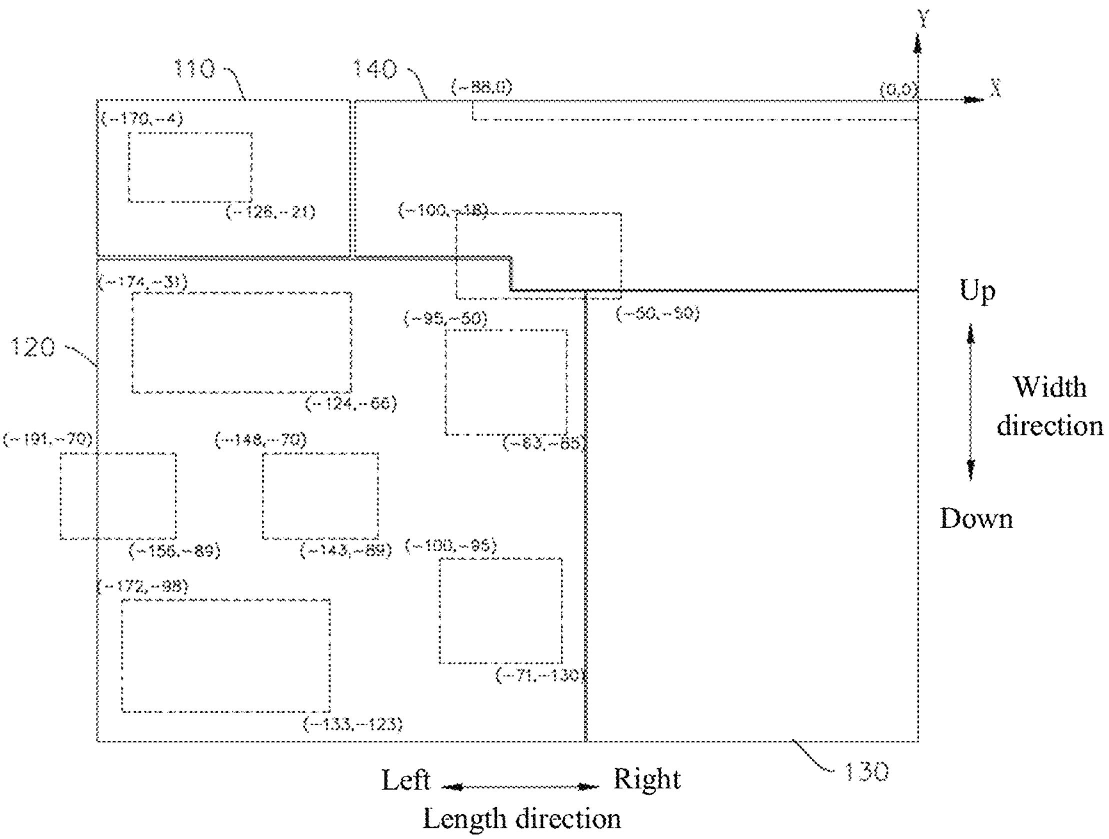
FIG. 3 is a schematic diagram illustrating the division of mounting areas of a substrate according to an embodiment of the present disclosure.

Refer to FIG. 3, it is a schematic diagram of the layout of main functional components in each circuit. In this embodiment, a Cartesian coordinate system is used as a reference coordinate system to explain the installation positions of the main functional components, and the layout of the circuits is optimized according to the Cartesian coordinate system, resulting in a more reasonable layout design and an optimal layout scheme. Moreover, the layout of the electrical control board 1000 takes into account the positions of external loads, and the module circuit area layout of main components is designed by considering production and circuit signal quality issues. The design involves adjusting the main components within specific coordinate ranges to achieve an optimized layout.

Specifically, referring to FIG. 3, the front surface of the substrate 100 can be understood as a plane where Cartesian coordinates are located, where a vertex position on the substrate 100 at the upper right corner is taken as an origin of the coordinate system, the length direction of the substrate 100 is an X-axis direction, the width direction of the substrate 100 is a Y-axis direction, a Z-axis direction is omitted, and the dimension unit in the coordinate system is mm.

Referring to FIG. 3, in the first mounting area 110, a distance between a center of the control chip 210 and the origin in the X-axis direction is X1, a distance between the center of the control chip 210 and the origin in the Y-axis direction is Y1, and the following constraints are satisfied: 126 mm≤X1≤170 mm and 4 mm≤Y1≤21 mm. According to the Cartesian coordinate system, it can be understood that the coordinate of the center of the control chip 210 in the coordinate system can be at a range of (−170, −4) to (−126, −21), and it can be understood that the coordinate range is in the first mounting area 110 and is a rectangular area. For example, the dashed area within the first mounting area 110 in FIG. 3 indicates an adjustable range of the center of the control chip 210. It should be noted that the center of the control chip 210 is based on a geometric center position, and it is considered to meet the design requirements as long as the center of the control chip 210 is within the aforementioned area range.

For example, the coordinates of the center point of the control chip 210 may be (−170, −4), (−150, −10), (−126, −4), (−126, −21) and son on, which is not further limited, and can be determined according to the actual installation requirements, thereby realizing the layout optimization of the control chip 210. Passive components are arranged according to the position of the control chip 210, making sure that the area of the first mounting area 110 is fully utilized. No heat dissipater 370 is needed for heat dissipation in the mounting area of the control chip 210, and the control chip 210 should be positioned away from a condenser of an air conditioner outdoor unit to prevent interference and impact from temperature. Adjustment within a rectangular range is permissible without affecting the overall layout structure and assembly.

It should be noted that since the origin of the Cartesian coordinate system is located on the substrate 100 at the upper right corner, it can be understood from the principle of the coordinate system that the first mounting area 110, the second mounting area 120, the third mounting area 130 and the fourth mounting area 140 are all located in negative value areas of the coordinate axis. That is, in the corresponding mounting areas, the corresponding coordinates are represented by negative values in the X-axis and Y-axis directions, and a distance between a coordinate point and the origin is calculated with a positive value.

Referring to FIGS. 2 and 3, the main functional components of the active PFC control circuit 300 include a PFC inductor 310, an IGBT 320, a FRD 330, and an electrolytic capacitor 340, where a distance between a center of the PFC inductor 310 and the origin in the X-axis direction is X2, a distance between the center of the PFC inductor 310 and the origin in the Y-axis direction is Y2, and the following constraints are satisfied: 71 mm≤X2≤100 mm and 95 mm≤Y2≤130 mm. It can be understood that the coordinate of the center of the PFC inductor 310 may be at a range of (−100, −95) to (−71, −130). That is, the rectangular area from (−100, −95) to (−71, −130) in FIG. 3 represents an adjustable range of the center of the PFC inductor 310.

It should be noted that the PFC inductor 310 is a main component of the active PFC control circuit 300, which operates at high temperature and requires comprehensive consideration of the impact of temperature on its surrounding components. The PFC inductor 310 is installed in the above-mentioned area (−100, −95) to (−71, −130), close to an edge of the substrate 100. Based on the circuit structure and component characteristics, the PFC inductor 310 can be kept away from a core control area and other high-power devices. This prevents temperature accumulation, enhances heat dissipation efficiency, and minimizes the impact of high working frequency signal interference on other module circuits.

Referring to FIG. 3, a distance between a center of the IGBT 320 and the origin in the X-axis direction is X3, a distance between the center of the IGBT 320 and the origin in the Y-axis direction is Y3, and the following constraints are satisfied: 156 mm≤X3≤191 mm and 70 mm≤Y3≤89 mm. That is, the adjustable coordinate of the center of the IGBT 320 can be ranged from (−191, −70) to (−156, −89).

It should be noted that the IGBT 320 generates a considerable amount of heat during operation. In the embodiment shown in FIG. 3, in order to improve the heat dissipation efficiency of the IGBT 320, a body of the IGBT 320 is extended beyond the coordinate range of the substrate 100. It can be understood that the maximum coordinate of the electrical control board 1000 in the Y-axis direction is X=−178. The body of the IGBT 320 can be cooled through the collaboration of a heat dissipater 370 and a support 360. Pins of the IGBT 320 are fixed on the substrate 100 by welding. The body of the IGBT 320 does not rely on the substrate 100. The IGBT 320 is supported by the support 360. The heat dissipater 370 is located in the second mounting area 120 and close to an air duct area of an air conditioner outdoor unit, thus improving the heat dissipation efficiency of the IGBT 320 and realizing effective cooling under higher load frequency control.

Referring to FIG. 3, a distance between a center of the FRD 330 and the origin in the X-axis direction is X4, a distance between the center of the FRD 330 and the origin in the Y-axis direction is Y4, and the following constraints are satisfied: 143 mm≤X4≤148 mm and 70 mm≤Y4≤89 mm. That is, the adjustable coordinate of the center of the FRD 330 can be ranged from (−148, −70) to (−143, −89). As shown in FIG. 3, an area of the FRD 330 is distributed consistent with a center line of the IGBT 320, which is beneficial to the improvement of plug-in efficiency in factory production and also saves PCB layout space.

Referring to FIG. 3, a distance between a center of the electrolytic capacitor 340 and the origin in the X-axis direction is X5, a distance between the center of the electrolytic capacitor 340 and the origin in the Y-axis direction is Y5, and the following constraints are satisfied: 63 mm≤X5≤95 mm and 50 mm≤Y5≤85 mm. That is, the adjustable coordinate of the center of the electrolytic capacitor 340 can be ranged from (−95, −50) to (−63, −85). As shown in FIG. 3, the electrolytic capacitor 340 and the PFC inductor 310 are mounted on the second mounting area 120 at the right side and close to the third mounting area 130, without affecting the mounting of the heat dissipater 370.

Referring to FIGS. 2 and 3, the frequency conversion control circuit 400 includes a frequency conversion IPM 410 and a MCU (not shown in the drawings). A distance between a center of the frequency conversion IPM 410 and the origin in the X-axis direction is X6, a distance between the center of the frequency conversion IPM 410 and the origin in the Y-axis direction is Y6, and the following constraints are satisfied: 124 mm≤X6≤174 mm and 31 mm≤Y6≤66 mm. That is, the adjustable coordinate of the center of the frequency conversion IPM 410 can be ranged from (−174, −31) to (−124, −66). It should be noted that an adjustment area of the frequency conversion IPM 410 is adjacent to an adjustment area of the control chip 210, which is beneficial to the reduction of interference by minimizing a control signal loop. Further, the position of a power device is away from a high temperature side of a condenser, thus reducing the influence of the temperature of the condenser on the heat dissipation of the power device.

Referring to FIGS. 2 and 3, the second mounting area 120 is further provided with a rectifier circuit including a bridge rectifier 350 for rectifying incoming AC power into DC power. A distance between a center of the bridge rectifier 350 and the origin in the X-axis direction is X7, a distance between the center of the bridge rectifier 350 and the origin in the Y-axis direction is Y7, and the following constraints are satisfied: 133 mm≤X7≤172 mm and 98 mm≤Y7≤123 mm. That is, the adjustable coordinate of the center of the bridge rectifier 350 can be ranged from (−172, 98) to (−133, −123).

It should be noted that the position of the bridge rectifier 350 can be adjusted according to the actual layout requirements, and a mounting area of the bridge rectifier 350 is separated from other power devices by a certain distance and is close to a vertex position of the substrate 100, thus facilitating heat dissipation.

Referring to FIGS. 2 and 3, the motor control circuit includes a low power frequency conversion IPM 700. A distance between a center of the low power frequency conversion IPM 700 and the origin in the length direction is X8, a distance between the center of the low power frequency conversion IPM 700 and the origin in the width direction is Y8, and the following constraints are satisfied: 50 mm≤X8≤100 mm and 18 mm≤Y8≤50 mm. That is, the adjustable coordinate of the center of the low power frequency conversion IPM 700 can be ranged from (−100, −18) to (−50, −50).

It can be understood that a DC motor control circuit and main power devices are separated from a heavy-current section. Considering device heating and electromagnetic interference (EMI) requirements, the low power frequency conversion IPM 700 is placed on an upper side of the second mounting area 120 and the third mounting area 130. In addition, in order to improve the heat dissipation effect of the low power frequency conversion IPM 700, a heat dissipater (not shown in the drawing) is provided at the position of the low power frequency conversion IPM 700 to improve the heat dissipation efficiency.

It should be noted that the fourth mounting area 140 is provided with an interface connected to a DC motor through plug-in connection, and an installation structure of the electrical control board 1000 has an opening reserved for the corresponding fourth mounting area 140. The operate principle of a motor control circuit is to separate the heavy current control area from MCU control area, enabling independent control of the fan and surrounding modules, reducing interference, and enhancing production efficiency. The low power frequency conversion IPM 700 is positioned away from the high-temperature region of the condenser, ensuring optimal heat dissipation and convenient wiring.

It can be understood that main heating sources of the electrical control board 1000 are those main power control components, including the IGBT 320, the frequency conversion IPM 410, the FRD 330 and the bridge rectifier 350. According to the layout of the above embodiment, the IGBT 320, the frequency conversion IPM 410, the FRD 330 and the bridge rectifier 350 are reasonably distributed in the second mounting area 120, and the heat dissipater 370 is arranged in the second mounting area 120 to cool down the above components, such that the high heating components has a uniformly distributed heat on a surface of the heat dissipater 370. Further, the mounting area of the high heating components is close to an air duct, which can effectively improve the heat dissipation efficiency.

Figure 4:
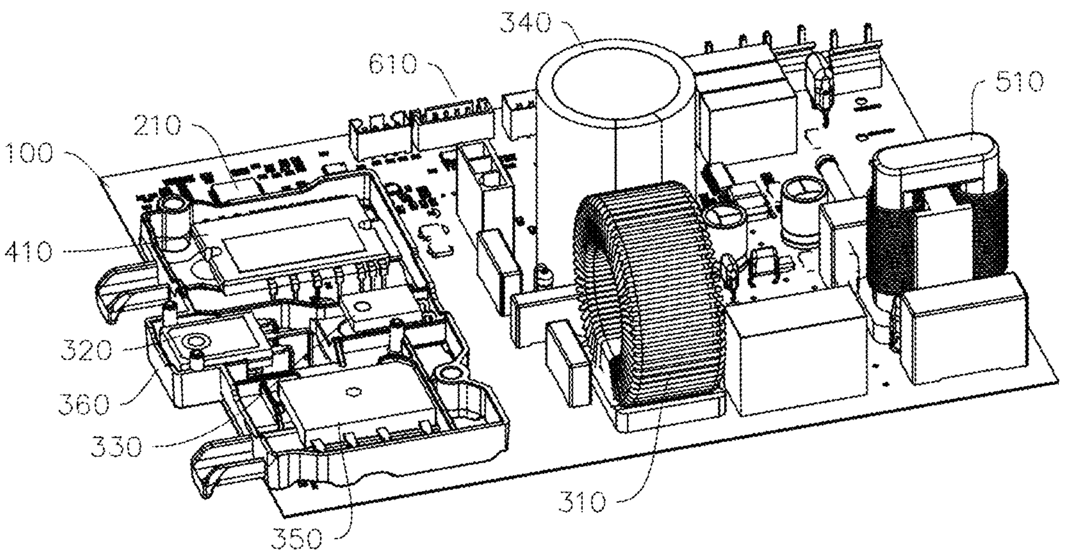
FIG. 4 is a schematic diagram of an electrical control board with a support according to an embodiment of the present disclosure.
Figure 5:
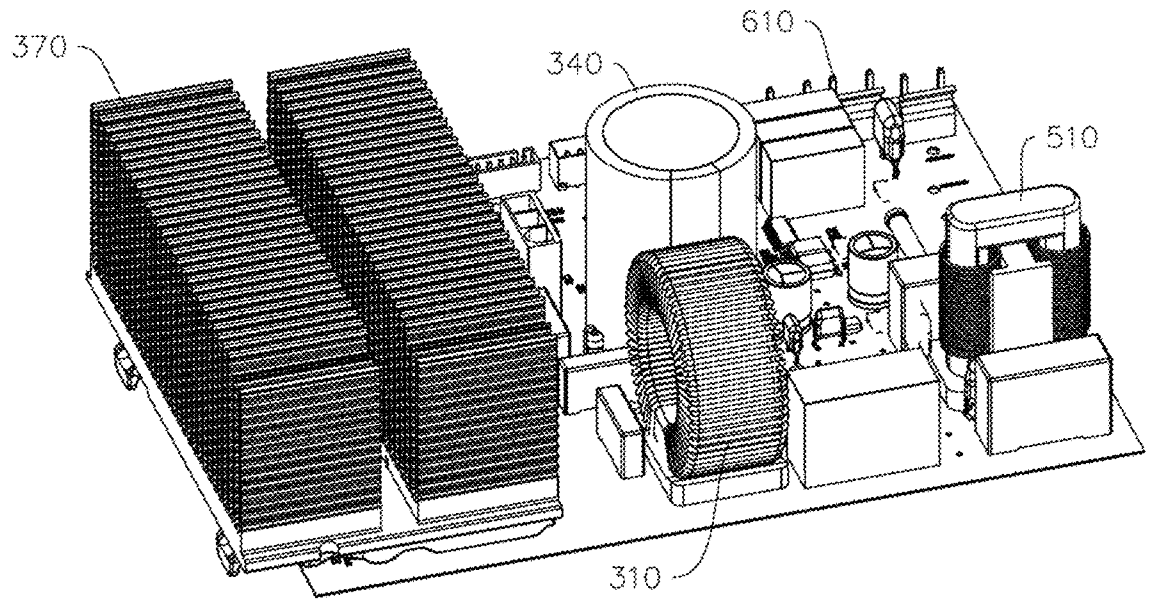
FIG. 5 is a schematic diagram of an electrical control board with a heat dissipater according to an embodiment of the present disclosure.

Referring to FIGS. 4 and 5, the support 360 is provided in the second mounting area 120, and the heat dissipater 370 is mounted on the support 360, such that the heat dissipater 370 can be supported and the compression of the heat dissipater 370 on the IPM and the rectifier module is reduced. In this embodiment, heat dissipating fins are distributed on an upper surface of the heat dissipater 370, and a bottom surface of the heat dissipater 370 is a heat conduction surface. During assembly, the bottom surface of the heat dissipater 370 is closely attached to the surfaces of the IGBT 320, the frequency conversion IPM 410, the FRD 330 and the bridge rectifier 350, such that heat from the heating sources can be transferred to the heat dissipater 370 and heat dissipation can be carried out through the heat dissipating fins.

FIG. 4 is a schematic diagram illustrating the connection between the support 360 and the substrate 100, where the support 360 is disposed around the IGBT 320, the frequency conversion IPM 410, the FRD 330, and the bridge rectifier 350. FIG. 5 is a schematic diagram illustrating the assembly of the heat dissipater 370, where the heat dissipating fins extend in a direction perpendicular to the front surface of the substrate 100, and the heat dissipater 370 is spaced from surrounding components by a safe distance to ensure effective heat dissipation. Considering the space occupied by the support 360 in the second mounting area 120, the second mounting area 120 is larger than other mounting areas.

Referring to FIGS. 1, 2, and 4, the power input circuit 500 is located in the third mounting area 130. AD power is converted into DC power through rectification after passing through the power input circuit 500. The power input circuit 500 includes a common mode choke 510 disposed close to the lower right corner of the substrate 100, away from other power devices.

The above optimized layout of the electrical control board 1000 is adopted, allowing its dimensions to be as small as 178 mm*138 mm or even smaller. The optimized power device layout meets the requirement of achieving higher carrier frequency control in same specification. Additionally, integration of full variable frequency control and ultra-high frequency PFC carrier frequency enables an EMI compatible design, resulting in a highly integrated control solution with high frequency and low interference.

Referring to FIGS. 1 and 2, the function interface circuit 600 includes a thin-film capacitor and a plurality of sockets 610 for connecting related loads within an air conditioner outdoor unit, such as a fan, a compressor, a sensor and so on. Different loads are connected to different sockets 610, and different types of sockets 610 are provided within the fourth mounting area 140. In this embodiment, the plurality of sockets 610 are arranged in a length direction of the fourth mounting area 140, and each of the plurality of sockets 610 is positioned near an upper edge of the substrate 100.

Referring to FIG. 3, the adjustable coordinate of the socket 610 may be ranged from (−88, 0) to (0, 10). The area with a coordinate of Y=0 corresponds to the upper edge of the substrate 100, and the position of different types of sockets 610 can be adjusted according to the actual load.

Figure 6:
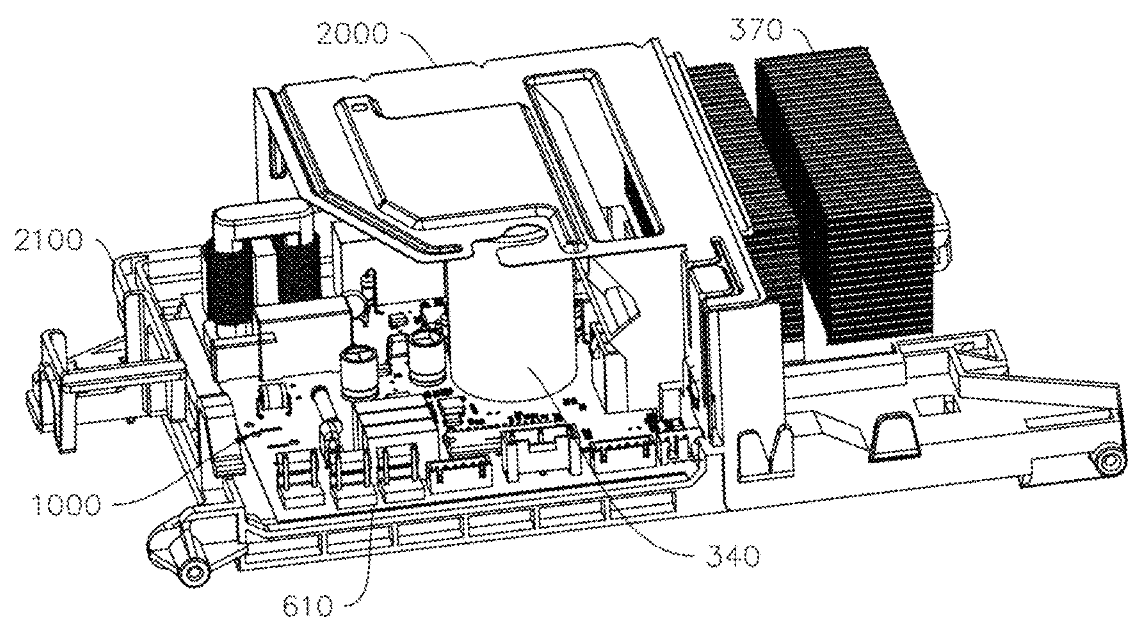
FIG. 6 is a schematic diagram of an electrical control box assembly according to an embodiment of the present disclosure.

Referring to FIG. 6, during assembly, the electrical control board 1000 is installed on an electrical control box 2000 to form an electrical control box assembly. The electrical control board 1000 is fixedly connected to a cover plate 2100 of the electrical control box 2000. The electrical control box assembly is installed on a body of an air conditioner outdoor unit in an inverted manner, that is to say, after being installed in place, circuit components on the electrical control board 1000 all face downwards. There is a reserved opening on the electrical control box 2000, the sockets 610 are concentrated on one side of the electrical control board 1000 and close to the opening. The opening faces the air conditioner outdoor unit, enabling workers to easily plug the plugs of various loads into the corresponding sockets 610, thus improving the efficiency of wiring. Further, the wiring can be concentrated on one side of the electrical control board 1000, making the wiring more organized, the operation easier, and effectively improving the assembly efficiency of the air conditioner outdoor unit.

An embodiment of the present disclosure also provides an air conditioner outdoor unit (not shown in the drawings), which includes the electrical control board 1000 in the above embodiment. The electrical control board 1000 in this embodiment is installed inside the air conditioner outdoor unit Specifically, the electrical control board 1000 can be installed inside the electrical control box 2000 to form an electrical control box assembly. A fan, a compressor and other components in the air conditioner outdoor unit are all connected to the electrical control board 1000. By adopting the layout in the above embodiment for the electrical control board 1000, the installation of various module circuits is more compact, and the layout design is more reasonable. High heating devices are installed near an air duct, which can effectively enhance heat dissipation efficiency and reduce a temperature rise. The optimized power device layout meets the requirement of achieving higher carrier frequency control in same specification. Additionally, integration of full variable frequency control and ultra-high frequency PFC carrier frequency enables an EMI compatible design, resulting in a highly integrated control solution with high frequency and low interference.

An embodiment of the present disclosure also provides an air conditioner (not shown in the drawings), which includes an air conditioner outdoor unit in the above embodiment. The air conditioner adopts all the technical schemes of an air conditioner outdoor unit in the above embodiment, thus having at least all beneficial effects brought by the technical schemes of the above embodiment.

Although the embodiments of the present disclosure have been described in detail above with reference to the accompanying drawings, the present disclosure is not limited to the above embodiments, and various changes may be made within the knowledge of those of ordinary skill in the art without departing from the purpose of the present disclosure.

What is claimed is:

1. An electrical control board comprising:
- a substrate including a first mounting area, a second mounting area, a third mounting area and a fourth mounting area, the substrate having a first side edge and a second side edge in a length direction, the first mounting area and the second mounting area being positioned adjacent to the first side edge and arranged in sequence at the substrate in a width direction, and the third mounting area and the fourth mounting area being positioned adjacent to the second side edge and arranged in sequence at the substrate in the width direction;
- a main control chip circuit arranged in the first mounting area;
- an active power factor correction (PFC) control circuit and a frequency conversion control circuit both arranged in the second mounting area;
- a power input circuit arranged in the third mounting area; and
- a function interface circuit arranged in the fourth mounting area;
- wherein the power input circuit, the active PFC control circuit, the frequency conversion control circuit, and the function interface circuit are sequentially connected, and the frequency conversion control circuit and the function interface circuit are connected to the main control chip circuit.

2. The electrical control board of claim 1, wherein the first side edge is located on a left side of a front surface of the substrate, the second side edge is located on a right side of the front surface of the substrate, and in a left-right direction of the substrate, the first mounting area is adjacent to the fourth mounting area and the second mounting area is adjacent to the third mounting area.

3. The electrical control board of claim 2, wherein in a direction perpendicular to the left-right direction of the substrate, the first mounting area is arranged in an upper position with respect to the second mounting area, and the fourth mounting area is arranged in an upper position with respect to the third mounting area.

4. The electrical control board of claim 1, further comprising:
- a motor control circuit arranged in the fourth mounting area.

5. The electrical control board of claim 4, wherein:
- the motor control circuit includes an intelligent power module (IPM); and
- a distance X8 in the length direction between a center of the IPM and an upper right corner of the substrate and a distance Y8 in the width direction between the center of the IPM and the upper right corner of the substrate satisfy: 50 mm<X8<100 mm and 18 mm≤Y8≤50 mm.

6. The electrical control board of claim 1, wherein:
- the main control chip circuit includes a control chip; and
- a distance X1 in the length direction between a center of the control chip and an upper right corner of the substrate and a distance Y1 in the width direction between the center of the control chip and the upper right corner of the substrate satisfy: 126 mm≤X1≤170 mm and 4 mm≤Y1≤21 mm.

7. The electrical control board of claim 1, wherein:
- the active PFC control circuit includes a PFC inductor; and
- a distance X2 in the length direction between a center of the PFC inductor and an upper right corner of the substrate and a distance Y2 in the width direction between the center of the PFC inductor and the upper right corner of the substrate satisfy: 71 mm<X2≤100 mm and 95 mm≤Y2≤130 mm.

8. The electrical control board of claim 1, wherein:
- the active PFC control circuit further includes an insulated gate bipolar transistor (IGBT); and
- a distance X3 in the length direction between a center of the IGBT and an upper right corner of the substrate and a distance Y3 in the width direction between the center of the IGBT and the upper right corner of the substrate satisfy: 156 mm<X3<191 mm and 70 mm≤Y3≤ 89 mm.

9. The electrical control board of claim 1, wherein:
- the active PFC control circuit includes a fast recovery diode (FRD); and
- a distance X4 in the length direction between a center of the FRD and an upper right corner of the substrate and a distance Y4 in the width direction between the center of the FRD and the upper right corner of the substrate satisfy: 143 mm<X4≤148 mm and 70 mm≤Y4≤ 89 mm.

10. The electrical control board of claim 1, wherein:
- the active PFC control circuit includes an electrolytic capacitor; and
- a distance X5 in the length direction between a center of the electrolytic capacitor and an upper right corner of the substrate and a distance Y5 in the width direction between the center of the electrolytic capacitor and the upper right corner of the substrate satisfy: 63 mm≤X5≤95 mm and 50 mm≤Y5≤85 mm.

11. The electrical control board of claim 1, wherein:
- the frequency conversion control circuit includes an intelligent power module (IPM); and
- a distance X6 in the length direction between a center of the IPM and an upper right corner of the substrate and a distance Y6 in the width direction between the center of the IPM and the upper right corner of the substrate satisfy: 124 mm<X6≤174 mm and 31 mm≤Y6≤ 66 mm.

12. Electrical control board of claim 1, further comprising:
- a rectifier circuit arranged in the second mounting area and including a bridge rectifier;
- wherein a distance X7 in the length direction between a center of the bridge rectifier and an upper right corner of the substrate and a distance Y7 in the width direction between the center of the bridge rectifier and the upper right corner of the substrate satisfy: 133 mm<X7<172 mm and 98 mm≤Y7≤123 mm.

13. The electrical control board of claim 1, wherein the function interface circuit is provided with a plurality of sockets arranged along an edge of the substrate.

14. The electrical control board of claim 1, wherein a length L of the substrate and a width W of the substrate satisfy: L≤178 mm and W≤138 mm.

15. An air conditioner outdoor unit comprising:
an electrical control board including:
a substrate including a first mounting area, a second mounting area, a third mounting area and a fourth mounting area, the substrate having a first side edge and a second side edge in a length direction, the first mounting area and the second mounting area being positioned adjacent to the first side edge and arranged in sequence at the substrate in a width direction, and the third mounting area and the fourth mounting area being positioned adjacent to the second side edge and arranged in sequence at the substrate in the width direction;
a main control chip circuit arranged in the first mounting area;
an active power factor correction (PFC) control circuit and a frequency conversion control circuit both arranged in the second mounting area;
a power input circuit arranged in the third mounting area; and
a function interface circuit arranged in the fourth mounting area;
wherein the power input circuit, the active PFC control circuit, the frequency conversion control circuit and the function interface circuit are sequentially connected, and the frequency conversion control circuit and the function interface circuit are connected to the main control chip circuit.

16. The air conditioner outdoor unit of claim 15, wherein the first side edge is located on a left side of a front surface of the substrate, the second side edge is located on a right side of the front surface of the substrate, and in a left-right direction of the substrate, the first mounting area is adjacent to the fourth mounting area and the second mounting area is adjacent to the third mounting area.

17. The air conditioner outdoor unit of claim 16, wherein in a direction perpendicular to the left-right direction of the substrate, the first mounting area is arranged in an upper position with respect to the second mounting area, and the fourth mounting area is arranged in an upper position with respect to the third mounting area.

18. The air conditioner outdoor unit of claim 15, wherein the electrical control board further includes a motor control circuit arranged in the fourth mounting area.

19. The air conditioner outdoor unit of claim 18, wherein:
the motor control circuit includes an intelligent power module (IPM); and
a distance X8 in the length direction between a center of the IPM and an upper right corner of the substrate and a distance Y8 in the width direction between the center of the IPM and the upper right corner of the substrate satisfy: 50 mm≤X8≤100 mm and 18 mm≤Y8≤50 mm.

20. An air conditioner comprising:
an air conditioner outdoor unit including an electrical control board, the electrical control board including:
a substrate including a first mounting area, a second mounting area, a third mounting area and a fourth mounting area, the substrate having a first side edge and a second side edge in a length direction, the first mounting area and the second mounting area being positioned adjacent to the first side edge and arranged in sequence at the substrate in a width direction, and the third mounting area and the fourth mounting area being positioned adjacent to the second side edge and arranged in sequence at the substrate in the width direction;
a main control chip circuit arranged in the first mounting area;
an active power factor correction (PFC) control circuit and a frequency conversion control circuit both arranged in the second mounting area;
a power input circuit arranged in the third mounting area; and
a function interface circuit arranged in the fourth mounting area;
wherein the power input circuit, the active PFC control circuit, the frequency conversion control circuit and the function interface circuit are sequentially connected, and the frequency conversion control circuit and the function interface circuit are connected to the main control chip circuit.

* * * * *